(12) United States Patent
Gac et al.

(10) Patent No.: US 11,599,764 B2
(45) Date of Patent: Mar. 7, 2023

(54) PRELAMINATE FOR AN ELECTRONIC CARD, AND METHODS FOR PRODUCING SUCH A PRELAMINATE AND AN ELECTRONIC CARD COMPRISING SUCH A PRELAMINATE

(71) Applicant: Idemia France, Courbevoie (FR)

(72) Inventors: Philippe Gac, Courbevoie (FR); Pierre Escoffier, Courbevoie (FR); Rémi Lavarenne, Courbevoie (FR)

(73) Assignee: IDEMIA FRANCE, Courbevoie (FR)

( * ) Notice: Subject to any disclaimer, the term of this patent is extended or adjusted under 35 U.S.C. 154(b) by 0 days.

(21) Appl. No.: 17/192,307

(22) Filed: Mar. 4, 2021

(65) Prior Publication Data

US 2021/0279544 A1 Sep. 9, 2021

(30) Foreign Application Priority Data

Mar. 6, 2020 (FR) ...................................... 2002275

(51) Int. Cl.
*G06K 19/077* (2006.01)
*H05K 1/02* (2006.01)
*H05K 1/03* (2006.01)

(52) U.S. Cl.
CPC ..... *G06K 19/07749* (2013.01); *H05K 1/0243* (2013.01); *H05K 1/0313* (2013.01)

(58) Field of Classification Search
CPC ........... G06K 19/07749; H05K 1/0243; H05K 1/0313

USPC .......................................................... 235/492
See application file for complete search history.

(56) References Cited

U.S. PATENT DOCUMENTS

| | | | |
|---|---|---|---|
| 2007/0152901 A1* | 7/2007 | Hockey ................... | H01Q 21/26 343/793 |
| 2008/0068175 A1* | 3/2008 | Hockey ..................... | H01Q 9/16 340/572.7 |
| 2008/0149736 A1* | 6/2008 | Kim ...................... | H01Q 1/2283 29/601 |
| 2013/0264390 A1* | 10/2013 | Frey .......................... | C23F 1/02 235/492 |
| 2021/0049431 A1* | 2/2021 | Finn ................. | G06K 19/07722 |
| 2021/0192311 A1* | 6/2021 | Lotya ............... | G06K 19/07769 |
| 2022/0121895 A1* | 4/2022 | Michieli .......... | G06K 19/07769 |

FOREIGN PATENT DOCUMENTS

| | | |
|---|---|---|
| FR | 2876539 A1 | 4/2006 |
| FR | 2938380 A1 | 5/2010 |

* cited by examiner

*Primary Examiner* — Michael G Lee
*Assistant Examiner* — David Tardif
(74) *Attorney, Agent, or Firm* — Nixon & Vanderhye

(57) ABSTRACT

The present invention relates to a prelaminate for an electronic card, wherein at least a first group of pads is formed from a metal plate formed from a piece comprising a central part and branches extending from the central part, the branches of the metal plate forming the pads of the first group. The invention also relates to a method for producing such a prelaminate and an electronic card comprising such a prelaminate.

14 Claims, 2 Drawing Sheets

[Fig. 1]
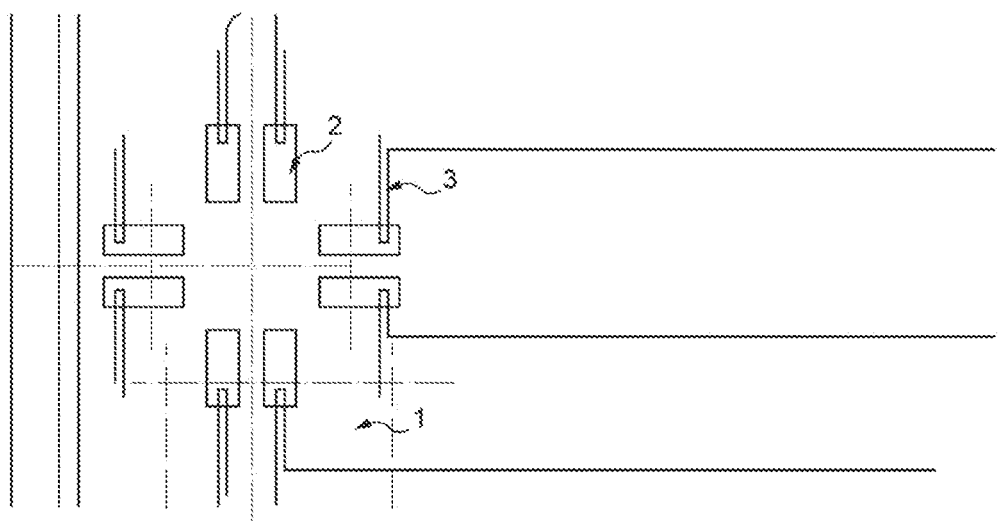
[Fig. 2]
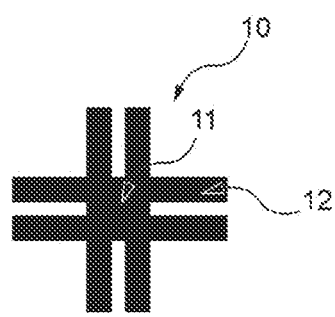

[Fig. 3]
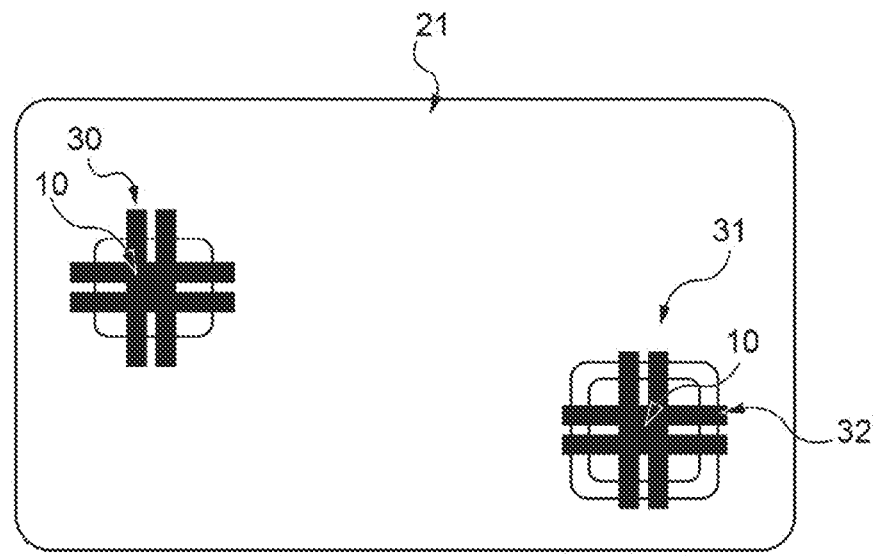
[Fig. 4]
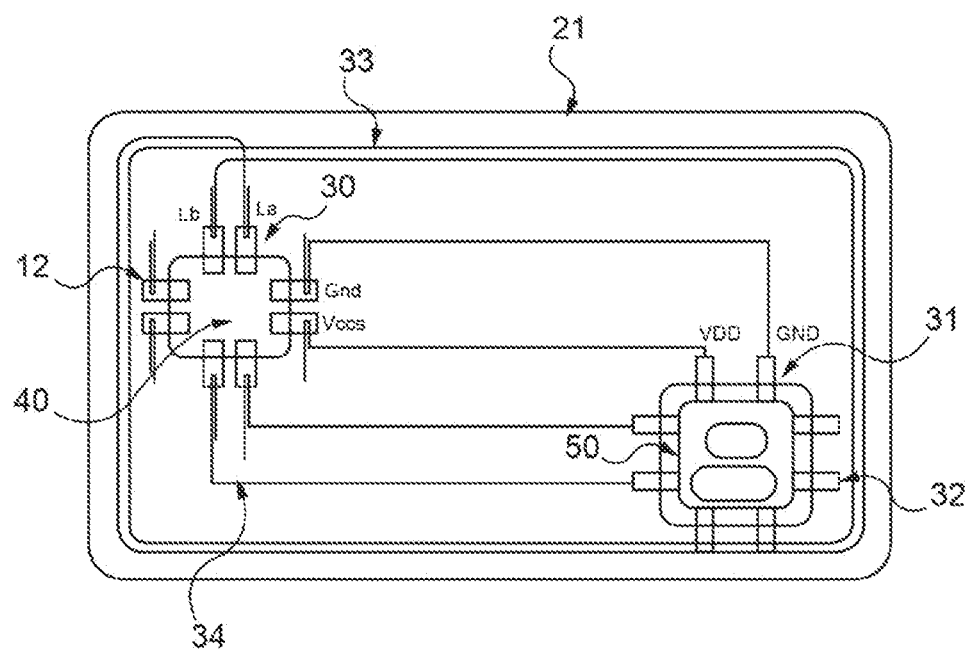

PRELAMINATE FOR AN ELECTRONIC CARD, AND METHODS FOR PRODUCING SUCH A PRELAMINATE AND AN ELECTRONIC CARD COMPRISING SUCH A PRELAMINATE

CROSS-REFERENCE TO RELATED APPLICATIONS

This application claims priority pursuant to 35 U.S.C. 119(a) of France Patent Application No. 2002275, filed Mar. 6, 2020, which application is incorporated herein by reference in its entirety.

FIELD OF THE INVENTION

The present invention relates to a prelaminate for an electronic card comprising an insert module.

It also relates to methods for producing such a prelaminate and such an electronic card.

BACKGROUND

An electronic card as considered herein typically comprises a body and at least one electronic component integrated into the body, either within the body, or in a cavity formed in the body and opening onto a surface of the body.

Generally, several electronic components are present.

An electronic component positioned in a cavity of the body and opening onto a surface of 7 the body is for example an insert module.

Several connections must generally be established with an electronic component, or between two of the components present in the card and having to exchange signals therebetween.

To support at least part of an electronic circuit connected to at least one electronic component, the electronic card may comprise for example a prelaminate, and/or a flex, for example made from polyimide (i.e. a polyimide printed circuit with electronic components mounted thereon), which is contained in a thickness of the electronic card.

A prelaminate typically comprises at least one substrate layer, for example made from PVC, on which at least one group of pads is formed.

But, each pad is produced and arranged individually, for example by bonding.

By way of example, a pad measures approximately 2 mm×6 mm, with a thickness of approximately 0.1 mm.

An electronic component is then connected to the pads of the corresponding group.

Optionally, bonding wires connect at least some of these pads to pads of another group, in order to connect two electronic components to one another for example.

The formation and the positioning of each of the pads, for each of the necessary groups, therefore requires great care and a length of time directly dependent on the number of pads to be produced.

Additionally, the accuracy in the implementation of each of the pads is a key factor to foster a satisfactory and reliable connection with an electronic component and/or between two electronic components, for example to at least allow satisfactory signal transmission therebetween.

The present invention thus aims to resolve at least in part the above-mentioned shortcomings, further leading to other advantages.

The present invention notably aims to facilitate the implementation of pads in a prelaminate.

SUMMARY

To this end, according to a first aspect, a prelaminate is proposed for an electronic card, comprising at least two substrates and at least a first group of pads assembled between the two substrates, characterized in that the prelaminate comprises a metal plate formed from a piece comprising a central part and branches extending from the central part, the branches of the metal plate forming the pads of the first group.

Thanks to such a metal plate formed from a single piece, the arrangement of pads in a prelaminate is thus greatly facilitated and accelerated.

It is thus possible to only perform a single positioning operation regardless of the number of pads to be arranged in a prelaminate.

Depending on the intended application, the metal plate comprises as many branches as there are number of pads necessary for an electronic component.

Thus, the metal plate comprises for example at least two branches, preferably at least three branches, for example at least six branches.

For example, the prelaminate comprises at least a second group of pads, at least one of the pads of the second group being connected to one of the branches of the metal plate by a bonding wire.

Such a prelaminate thus makes it possible to connect at least two electronic components to one another.

According to a beneficial example embodiment, the prelaminate comprises a second metal plate formed from a piece comprising a central part and branches extending from the central part, the branches of the second metal plate forming the pads of the second group.

The production of such a prelaminate is thus further facilitated when several electronic components are required.

In a specific example, the prelaminate comprises an antenna having two ends, the two ends of the antenna being connected to two of the branches of the metal plate of the first group.

Such an antenna enables for example contactless operation for an electronic card.

The invention also relates to an electronic card comprising a prelaminate as previously described, as well as a first cavity formed from a surface of the electronic card, the first cavity having a bottom into which the pads of the first group open, and a first insert module in the first cavity and connected to the pads of the first group.

The central part of the metal plate has for example been removed, thus isolating the pads from each other.

For example, the electronic card comprises a second cavity formed from a surface of the electronic card, the second cavity having a bottom into which the pads of the second group open, and a second insert module in the second cavity and connected to the pads of the second group.

In a beneficial example embodiment, the first module comprises a dual chip, and the second module comprises a biometric sensor.

According to another aspect of the invention, a method for producing a prelaminate as previously described is also proposed. The method comprises for example:
- A step for providing at least two substrates;
- A step for providing a metal plate formed from a piece comprising a central part and branches extending from the central part, the branches forming a first group of pads;
- A step for positioning the metal plate in relation to at least one first of the two substrates;
- A step for laminating the at least two substrates, the metal plate being between the two substrates.

Thanks to such a metal plate formed from a single piece, the production of a prelaminate is easier and quicker to implement. It also allows better accuracy in the arrangement of the pads.

It is thus possible to only perform a single positioning operation regardless of the number of pads to be arranged in a prelaminate.

In an exemplary implementation, the step for positioning the metal plate with at least the first of the two substrates comprises a step for embedding the metal plate in the first substrate.

According to a beneficial example, the method further comprises a step for providing a second group of pads, and a step for connecting at least one of the pads of the second group to one of the branches of the metal plate by a bonding wire.

In a beneficial example, the method comprises a step for providing an antenna having two ends, and a step for connecting two ends of the antenna to two of the branches of the metal plate.

According to another aspect of the invention, a method for producing an electronic card is also proposed, comprising:
- Method steps for producing a prelaminate as previously described; and
- A machining step comprising at least one sub-step of removing the central part of the metal plate of the first group of pads and a sub-step of stripping at least one of the branches of the metal plate forming a pad of the first group.

In an exemplary implementation, the method further comprises a step for providing two cover layers, and a step for laminating the prelaminate between the two cover layers arranged on either side of the prelaminate.

In a particular example, the machining step further comprises a sub-step of removing a central part from a metal plate forming a second group of pads and a sub-step of stripping at least one pad of the second group.

According to a beneficial example, the method further comprises a step for inserting and for connecting a first module to pads of the first group.

Where applicable, the method also comprises a step for inserting and for connecting a second module to pads of the second group.

BRIEF DESCRIPTION OF THE DRAWINGS

The invention, according to an example embodiment, will be better understood and its advantages will be better seen by reading the following detailed description, given as a non-limiting example, referring to the appended drawings wherein:

FIG. 1 schematically depicts an example embodiment of a group of pads in a prelaminate according to the prior art;

FIG. 2 illustrates a group of pads made by a metal plate from a single piece according to an example embodiment of the invention;

FIG. 3 shows an arrangement of metal plates from FIG. 2 in a prelaminate; and,

FIG. 4 schematically illustrates a card after machining comprising a prelaminate and cavities, according to an example embodiment of the invention.

DETAILED DESCRIPTION

The identical features depicted in the above-mentioned figures are identified by identical numerical references.

As shown in FIG. 1, traditionally, a prelaminate comprises at least one substrate 1 and pads 2, necessary to connect an electronic component, which are made and arranged individually, often by bonding for example, to the substrate 1.

By way of example, a pad 2 measures approximately 2 mm×6 mm at the surface, with a thickness of approximately 0.1 mm.

At least some pads 2 may, furthermore, be connected by a bonding wire 3 to another electronic component, not shown, which is connected via other pads, not visible on this figure, also formed and arranged on the substrate 2.

In the example embodiment of FIG. 1, the substrate 1 is equipped with eight pads 2, each of which is connected herein to a bonding wire 3.

The formation and the positioning of each of the pads, according to a desired accuracy, is thus difficult to manage and therefore requires great care and a length of time directly dependent on the number of pads to be produced.

To improve the production of such a prelaminate, and in particular to facilitate the arrangement of pads intended to be connected to an electronic component, the pads according to the invention are formed together from the same metal plate 10, depicted in FIG. 2.

The metal plate 10 is formed by a single piece and comprises a central part 11 and branches 12 extending from the central part 11. Thus, all the branches are connected to one another thanks to the central part.

Each of the branches 12 is thus configured to form a pad of a group of pads making it possible to subsequently connect an electronic component thereto.

Once the metal plate 10 is positioned in a substrate, the central part 11 is removed and each of the branches 12 is thus isolated from the others.

Herein, in the example embodiment of FIG. 2, the metal plate 10 comprises eight branches 12, arranged crosswise in groups of two.

Thus, the metal plate 10 in FIG. 2 is configured to replace the group of pads 2 in FIG. 1 for example.

However, the number of branches depends on the intended application.

The metal plate 10 is for example made of copper.

As shown in FIG. 3, the arrangement of the pads in a prelaminate is thus greatly facilitated and accelerated, notably due to the fact that it is possible to perform only a single positioning operation regardless of the number of pads to be arranged in a prelaminate.

FIG. 3 shows a substrate 21 of such a prelaminate.

Such a substrate is for example made of PVC or PET.

The substrate 21 herein has a form corresponding to that of a prelaminate of an electronic card for which it is intended.

The substrate 21 herein comprises two groups of pads: a first group 30 of pads and a second group 31 of pads.

In accordance with the invention, a metal plate 10 such as the one represented in FIG. 2 is arranged on the substrate 21 in order to form the pads of the first group 30 of pads to subsequently connect an electronic component thereto.

Herein, the eight desired pads are thus positioned on a surface of the substrate 21 in a single operation.

For certain fields of application, it may be desirable to produce a prelaminate configured to connect at least two electronic components to one another, such as for example a chip and a biometric sensor.

To this end, as shown in FIG. 3, the substrate 21 is then equipped with the second group 31 of pads 32.

The second group 31 of pads may be produced by arranging each of the pads 32 individually, or, as shown, by using a second metal plate 10 in accordance with the invention, for example such as the one depicted in FIG. 2 depending on the desired number of pads, which further facilitates the production of the prelaminate concerned.

In the present example embodiment, the second group 31 of pads also comprises eight pads 32.

To produce the prelaminate on this basis, each of the metal plates 10 required for the application considered is for example arranged on the substrate 21.

If necessary, at least one of the branches 12 and/or the central part 11 may be bonded to the substrate 21.

It may be intended to produce at least one weld point locally to melt material of the substrate 21 on the metal plate 10 and thus to create a connection point so that the metal plate 10 is maintained, for example, before and during a laminating step.

A second substrate, not shown, may for example be applied to the first substrate 21, at least the metal plate 10 being arranged between the two substrates.

According to another example, the substrate, including the metal plate 10, is sandwiched between two other substrates, i.e. a third substrate is then arranged on an opposite face of the substrate 21 relative to that comprising the metal plate 10.

In an example embodiment, a substrate of the prelaminate may comprise a window in which the metal plate 10 is arranged.

An adhesive patch of larger dimensions than those of the window may be bonded to a face of the corresponding substrate to close the window. Thus the metal plate is deposited and maintained by the adhesive patch.

The substrate 21, optionally covered by at least one other substrate, or even sandwiched between two other substrates, is then heated and pressed to form the prelaminate.

The prelaminate obtained has for example a thickness of at the most 500 µm, or even 430 µm.

Then, to produce an electronic card comprising the prelaminate as previously described, the prelaminate is for example laminated between two cover layers, arranged on either side of the prelaminate.

A machining step then makes it possible to form at least a first cavity.

During this step, the central part 11 of the metal plate 10 is removed, which then isolates, at least electrically, each of the branches 12 relative to the other branches.

Furthermore, at least some of the branches 12 are stripped, which makes it possible to subsequently connect an electronic component thereto, for example a chip of a module.

In such a case, the machining step therefore affects at least one of the cover layers and/or at least one part of the prelaminate, for example a substrate covering the metal plate 10.

The same may be true for the formation of a second cavity in order to connect a second module to the second group 31 of pads 32.

In FIG. 4, an electronic card comprising a substrate 21 as previously described is further equipped with an antenna 33 connected to two of the branches 12 of the first group 30, thus forming pads La and Lb.

The other branches 12 herein form, for example, I/O (input/output) pads for the data, or "clock".

As an example embodiment shown here, pads are designated, in a clockwise direction from pad La, Gnd and Vccs, the others being for example configured for data transmission.

The pads 32 of the second group 31 represent herein, for example, connections GND and VDD, other pads being for example possibly configured for data transmission.

In the present example embodiment, bonding wires 34 thus connect pads of the first group 30 to pads of the second group 31. For example, herein, pad Gnd of the first group 30 to pad GND of the second group 31, and pad Vccs of the first group 30 to pad VDD of the second group 31.

Herein, two of the pads 12 of the first group 31 are not connected to another pad, just like four of the pads 32 of the second group 31.

Once the desired cavities are formed, for example as previously described, herein two cavities, a first module 40 and a second module 50 are inserted, respectively here in the first cavity and the second cavity.

The first module 40 is thus then connected to the pads of the first group 30, herein formed beforehand by a metal plate 10, and the second module 50 is then connected to the pads 32 of the second group 31, also herein formed beforehand by a metal plate.

By way of example, for more secure use of certain electronic cards, such as for example those intended to process payments, an electronic card may comprise a biometric sensor, such as for example a fingerprint sensor, and a dedicated chip (for example so-called "EMV" for "Europay Mastercard Visa" which denotes the international security standard for payment cards (chip cards)) which processes the data of the biometric sensor.

Thus, in an example embodiment considered herein, the first module 40 comprises an electronic component, which is for example a chip, depicted connected to the pads of the first group 30.

The chip is possibly arranged on a support comprising contact pads for use by contact with an external terminal. The first module 40 is thus for example a dual module.

In parallel, the second group 31 of pads 32 is configured to connect a second module 50 comprising an electronic component which is for example a biometric sensor, for example a fingerprint sensor.

The chip of the first module 40 is thus on the one hand connected to the pads of the first group 30 and the biometric sensor is on the other hand connected to the pads of the second group 31, the pads of each of these two groups being connected by bonding wires 34 in order to connect the chip to the biometric sensor.

As previously explained, several connections must therefore be established between the chip and the biometric sensor, for example four connections here: for example the supply, the earth and two data buses.

The supply to the biometric sensor can thus be achieved by a regulator of the chip.

As is also shown in FIG. 4, not all the pads are used.

Thus here for example, the two remaining pads on the chip side may be used based upon the application and/or the sensor chosen (this depends on the electronics of the sensor, its communication protocol, etc).

The invention claimed is:

1. A prelaminate for an electronic card, the prelaminate comprising:
   at least two substrates;
   at least a first group of pads assembled between the two substrates; and
   a metal plate formed from a piece comprising
   a central part, and
   at least two branches which extend from the central part, the at least two branches of the metal plate forming the pads of the first group, a first of the at least two branches being perpendicular to a second of the at least two branches.

2. The prelaminate according to claim 1, further comprising at least a second group of pads, at least one of the pads of the second group (31) being connected to one of the branches of the metal plate by a bonding wire.

3. The prelaminate according to claim 2, further comprising a second metal plate formed from a piece comprising
   a central part, and
   branches extending from the central part (11), the branches of the second metal plate forming the pads of the second group.

4. The prelaminate according to claim 1, further comprising an antenna having two ends, the two ends of the antenna being connected to two of the branches of the metal plate of the first group.

5. The prelaminate according to claim 1, wherein the at least two branches include at least a first set of branches extending perpendicular to a second set of branches.

6. The method according to claim 1, wherein the at least two branches that are provided include at least a first set of branches extending perpendicular to a second set of branches.

7. A method for producing a prelaminate, the method comprising:
   providing at least two substrates;
   providing a metal plate formed from a piece comprising a central part and at least two branches extending from the central part, the at least two branches forming a first group of pads, a first of the at least two branches being perpendicular to a second of the at least two branches;
   positioning the metal plate in relation to at least a first substrate of the two substrates; and
   laminating the at least two substrates, the metal plate being between the two substrates.

8. The method according to claim 7, wherein the positioning the metal plate with at least the first substrate of the two substrates comprises embedding the metal plate in the first substrate.

9. The method according to claim 7, further comprising:
   providing a second group of pads; and
   connecting at least one of the pads of the second group to one of the branches of the metal plate by a bonding wire.

10. The method according to claim 7, further comprising:
    providing an antenna having two ends; and
    connecting the two ends of the antenna to two of the branches of the metal plate.

11. A method for producing an electronic card, the method comprising:
    the method for producing the prelaminate according to claim 7; and
    machining comprising
    removing the central part of the metal plate of the first group of pads, and
    stripping at least one of the branches of the metal plate forming one of the pads of the first group.

12. The method according to claim 11, further comprising:
    providing two cover layers; and
    laminating the prelaminate between the two cover layers arranged on either side of the prelaminate.

13. The method according to claim 11, wherein the machining further comprises:
    removing a central part of a metal plate forming a second group of pads, and
    stripping at least one pad of the second group.

14. The method according to claim 11, further comprising inserting and connecting a first module to the pads of the first group.

* * * * *